United States Patent
Kang

(10) Patent No.: US 7,969,797 B2
(45) Date of Patent: Jun. 28, 2011

(54) SEMICONDUCTOR MEMORY DEVICE AND METHOD FOR OPERATING THE SAME

(75) Inventor: Khil-Ohk Kang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 207 days.

(21) Appl. No.: 12/266,504

(22) Filed: Nov. 6, 2008

(65) Prior Publication Data

US 2009/0168585 A1 Jul. 2, 2009

(30) Foreign Application Priority Data

Dec. 27, 2007 (KR) ........................ 10-2007-0138583

(51) Int. Cl.
 *G11C 5/14* (2006.01)
(52) U.S. Cl. ................. 365/189.09; 365/226; 365/191; 365/241; 365/189.07; 365/189.08
(58) Field of Classification Search ............. 365/189.09, 365/226, 191, 289.07, 189.08
See application file for complete search history.

(56) References Cited

U.S. PATENT DOCUMENTS

| | | | |
|---|---|---|---|
| 5,912,856 A * | 6/1999 | Lee et al. | ....................... 365/226 |
| 6,316,985 B1 | 11/2001 | Kobayashi et al. | |
| 7,009,904 B2 | 3/2006 | Kim | |
| 2005/0104566 A1 | 5/2005 | Kim | |
| 2005/0105367 A1 | 5/2005 | Kim et al. | |
| 2007/0109900 A1 * | 5/2007 | Sakurai et al. | ................ 365/226 |

FOREIGN PATENT DOCUMENTS

| | | |
|---|---|---|
| JP | 10-199244 | 7/1998 |
| JP | 11-026697 | 1/1999 |
| KR | 1998-0064811 | 10/1998 |
| KR | 1020030097024 A | 12/2003 |

OTHER PUBLICATIONS

Notice of Preliminary Rejection issued from Korean Intellectual property Office on Jan. 29, 2009 with an English translation.
Notice of Allowance issued from Korean Intellectual Property Office on May 30, 2009 with an English Translation.

* cited by examiner

*Primary Examiner* — Thong Q Le
(74) *Attorney, Agent, or Firm* — IP & T Group LLP

(57) ABSTRACT

A semiconductor memory device includes a voltage detector configured to detect a level of an external power supply voltage and an internal voltage generator configured to generate an internal voltage in response to an active signal and drive an internal voltage terminal with a driving ability corresponding to an output signal of the voltage detector. A method for operating the semiconductor memory device includes detecting a level of an external power supply voltage, based on a first target level, to output a detection signal; and generating an internal voltage in response to an active signal, and driving an internal voltage terminal with a driving ability corresponding to the detection signal.

19 Claims, 8 Drawing Sheets

FIG. 8
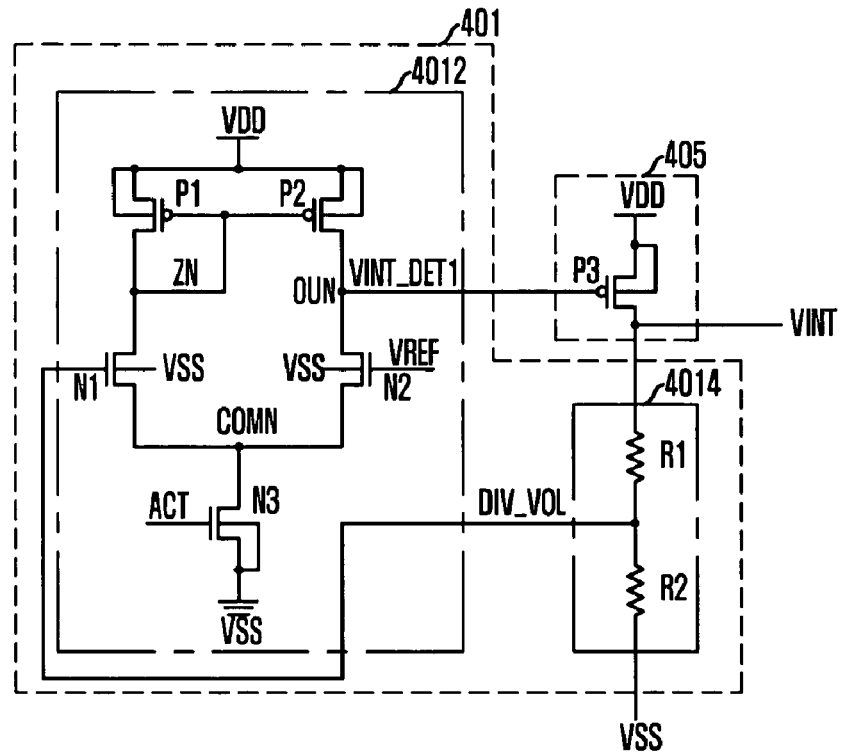
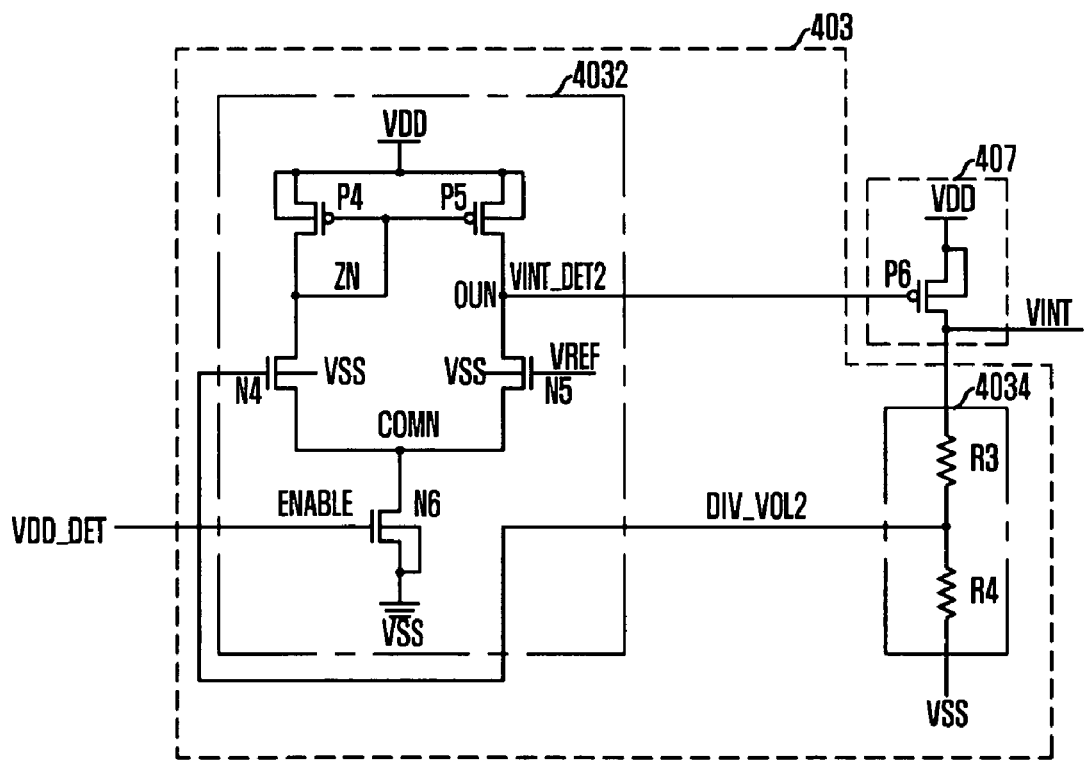

SEMICONDUCTOR MEMORY DEVICE AND METHOD FOR OPERATING THE SAME

CROSS-REFERENCE TO RELATED APPLICATION

The present invention claims priority of Korean patent application number 10-2007-0138583, filed on Dec. 27, 2007, which is incorporated by reference in its entirety.

BACKGROUND OF THE INVENTION

The present invention relates to a semiconductor device, and more particularly, to an internal voltage generating circuit for generating an internal voltage that is used in an internal operation of a semiconductor memory device, which is capable of maintaining an internal voltage at a stable level even when a level of an external power supply voltage changes unstably.

Most semiconductor devices, e.g., dynamic random access memory (DRAM), include an internal voltage generating circuit inside a chip to generate internal voltages necessary for operations of internal circuits. The internal voltage generating circuit is a circuit for generating internal voltages of various levels by using an external power supply voltage (VDD) and a ground voltage (VSS).

The generation of a plurality of internal voltages includes an operation of generating a reference voltage and an operation of charge-pumping or down-converting the generated reference voltage.

Examples of a representative internal voltage generated using the charge pumping operation include a high voltage (VPP) and a back bias voltage (VBB), and examples of a representative internal voltage generated using the down-converting operation include a core voltage (VCORE).

The high voltage (VPP) is a voltage higher than an external power supply voltage (VDD). Upon access to a memory cell, the high voltage (VPP) is applied to a word line connected to a gate of a cell transistor in order to prevent loss of cell data, which is caused by a threshold voltage (Vth) of the cell transistor.

The back bias voltage (VBB) is a voltage lower than an external ground voltage (VSS). The back bias voltage (VBB) reduces the variation of the threshold voltage (Vth) of the cell transistor, which is caused by a body effect, thereby improving the operation stability of the cell transistor and reducing a channel leakage current generated at the cell transistor.

The core voltage (VCORE) is a voltage lower than an external power supply voltage (VDD) and higher than a ground voltage (VSS). The core voltage (VCORE) reduces power that is necessary to maintain a voltage level of data stored in a memory cell, and is used for stable operation of the cell transistor.

The internal voltage generating circuit generating the internal voltages (VPP, VBB, VCORE) is designed to operate at a predetermined deviation value within an operating voltage region and an operating temperature range of the semiconductor memory device.

FIG. 1 is a block diagram of a conventional semiconductor memory device.

Referring to FIG. 1, the conventional semiconductor memory device includes an active signal generator 120 for generating an active signal ACT, a level of which is determined according to an operation of the semiconductor memory device, a bandgap reference voltage generator 140 for generating a reference voltage VREF maintaining a constant target level, regardless of variation of process, voltage and temperature (PVT) of the semiconductor memory device, and an internal voltage generator 100 for generating an internal voltage VINT having a predefined level, based on the target level of the reference voltage VREF, in response to the active signal ACT.

In addition, the internal voltage generator 100 includes an internal voltage detecting unit 102 and an internal voltage driving unit 104. The internal voltage detecting unit 102 detects a level of an internal voltage (VINT) terminal, based on the target level of the reference voltage VREF, to generate an internal voltage detection signal VINT_DET in response to the active signal ACT. The internal voltage driving unit 104 drives the internal voltage (VINT) terminal with a predefined driving ability in response to the internal voltage detection signal VINT_DET.

The internal voltage VINT generated through the above-described procedures is input to the internal circuit 160 and used to enable the internal circuit 160 to perform a predefined internal operation.

In the internal voltage generator 100, a detailed circuit of the internal voltage driving unit 104 may be changed according to the kinds of the generated internal voltage. For example, a circuit for the pumping voltage (VPP) generated by the charge pumping operation is different from a circuit for the core voltage (VCORE) generated by the down-converting operation. However, their generation principles are similar to each other. Therefore, the circuit for the core voltage (VCORE) generated by the down-converting operation, which is simpler in the circuit configuration, will be described below. That is, the internal voltage VINT refers to the core voltage VCORE in the following description.

FIG. 2 is a circuit diagram of the internal voltage generator of FIG. 1

Referring to FIG. 2, the internal voltage generator 100 for generating the internal voltage VINT includes the internal voltage detecting unit 102 and the internal voltage driving unit 104.

The internal voltage detecting unit 102 includes a voltage comparator 1022 and a voltage divider 1024. The voltage divider 1024 divides a level of the internal voltage (VINT) terminal at a predefined ratio to generate a divided voltage DIV_VOL. In response to the active signal ACT, the voltage comparator 1022 compares the reference voltage VREF corresponding to the target level with the divided voltage DIV_VOL and outputs the internal voltage detection signal VINT_DET according to the comparison result.

The voltage divider 1024 of the internal voltage detecting unit 102 includes a first resistor R1 and a second resistor R2 connected in series between the internal voltage (VINT) terminal and a ground voltage (VSS) terminal. The divided voltage DIV_VOL is output through a connection node DIN of the first resistor R1 and the second resistor R2.

The voltage comparator 1022 of the internal voltage detecting unit 102 includes a first NMOS transistor N1, a second NMOS transistor N2, a first PMOS transistor P1, a second PMOS transistor P2, and a third NMOS transistor N3. The first NMOS transistor N1 has a gate receiving the divided voltage DIV_VOL, and a drain and a source connected between a driving node ZN and a common node COMM. The first NMOS transistor N1 controls a current flowing between the driving node ZN and the common node COMM in response to the divided voltage DIV_VOL. The second NMOS transistor N2 has a gate receiving the reference voltage VREF corresponding to the target level, and a drain and a source connected between an output node OUN and the common node COMM. The second NMOS transistor N2 controls a current flowing between the output node OUN and the common node COMM in response to the reference voltage VREF. The first PMOS transistor P1 and the second PMOS transistor P2 are connected between the driving node ZN and the output node OUN in a current mirror configuration and equalizes the current flowing through the driving node ZN and the current flowing through the output node OUN. The third NMOS transistor N3 has a gate receiving the active signal ACT, and a drain and source connected between the common node COMM and the ground voltage (VSS) terminal. The third NMOS transistor N3 controls the electrical connection of the common node COMM and the ground voltage (VSS) terminal in response to the active signal ACT.

In addition, the internal voltage driving unit 104 includes a PMOS transistor P3 having a gate receiving the internal voltage detection signal VINT_DET, and a source and a drain connected between the power supply voltage (VDD) terminal and the internal voltage (VINT) terminal. The PMOS transistor P3 controls a current flowing from the power supply voltage (VDD) terminal and the internal voltage (VINT) terminal in response to the internal voltage detection signal VINT_DET.

The operation of generating the internal voltage VINT in the conventional semiconductor memory device will be described below.

When the activated active signal ACT is input from the active signal generator 120, the internal voltage generator 100 starts to operate. The bandgap reference voltage generator 140 must already start to operate to generate the reference voltage VREF corresponding to the target level.

When the internal voltage generator 100 starts to operate, the internal voltage detecting unit 102 detects if the level of the internal voltage (VINT) terminal is higher than the target level of the reference voltage VREF. At this point, when the level of the internal voltage (VINT) terminal is higher than the target level, the internal voltage (VINT) terminal need not be driven. Thus, the internal voltage detecting unit 102 outputs the deactivated internal voltage detection signal VINT_DET. When the level of the internal voltage (VINT) terminal is lower than the target level, the internal voltage (VINT) terminal must be driven. Thus, the internal voltage detecting unit 102 outputs the activated internal voltage detection signal VINT_DET.

When the deactivated internal voltage detection signal VINT_DET is applied, the internal voltage driving unit 104 performs no operations. On the contrary, when the activated internal voltage detection signal VINT_DET is applied, the internal voltage driving unit 104 performs the operation of driving the internal voltage VINT.

At this point, the internal voltage driving unit 104 drives the internal voltage VINT to the external power supply voltage VDD by using a driver having a predefined driving ability. That is, since the level of the internal voltage (VINT) terminal does not reach the target level, the level of the internal voltage (VINT) terminal is increased by applying the external power supply voltage VDD higher than the target level to the internal voltage (VINT) terminal.

In this way, when the internal voltage driving unit 104 operates to increase the level of the internal voltage (VINT) terminal above the target level, the internal voltage detecting unit 102 detects the increased level of the internal voltage (VINT) terminal and stops the operation of the internal voltage driving unit 104.

By repeating the above-described operations, the internal voltage generator 100 operates such that the level of the internal voltage (VINT) terminal is always maintained at the target level in the activation period of the active signal ACT.

If the level of the external power supply voltage VDD changes due to the PVT variation of the semiconductor memory device, the internal voltage driving unit 104 of the internal voltage generator 100 operates as described below.

FIG. 3 is a waveform diagram of the internal voltage during the operation of generating the internal voltage in the conventional semiconductor memory device of FIG. 1.

Referring to FIG. 3, at a timing ① where the internal voltage driving unit 104 starts to operate, the internal circuit 160 uses the internal voltage VINT in operation so that the level of the internal voltage (VINT) terminal becomes lower than the target level. In addition, since the timing ① is a timing where the operation of the internal circuit 160 is not finished, it is expected that the level of the internal voltage (VINT) terminal will continuously fall.

Therefore, the internal voltage driving unit 104 must prevent the level of the internal voltage (VINT) terminal from being further lowered at a timing ② where the operation of the internal circuit 160 is not finished, and increase the level of the internal voltage (VINT) terminal at a timing ③ where the operation of the internal circuit 160 is finished, so that the level of the internal voltage (VINT) terminal can maintain the voltage level corresponding to the target level.

When the level of the external power supply voltage VDD is maintained at the predefined level, the predefined driving ability of the internal voltage driving unit 106 is enough to drive the internal voltage (VINT) terminal. Thus, the internal voltage driving unit 106 may operate to prevent the level of the internal voltage (VINT) terminal from falling below an allowable lower limit at the timing ②, that is, before the operation of the internal circuit 160 is finished. Also, the internal voltage driving unit 106 may operate to increase the level of the internal voltage (VINT) terminal in a relatively short time at the timing ③ where the operation of the internal circuit 160 is finished, so that the level of the internal voltage (VINT) terminal can maintain the level corresponding target level.

However, when the level of the external power supply voltage VDD is lower than the predefined level, the predefined driving ability of the internal voltage driving unit 106 is not enough to drive the internal voltage (VINT) terminal. Thus, even though the internal voltage driving unit 106 operates, the driving ability to increase the level of the internal voltage VINT is deficient and the level of the internal voltage (VINT) terminal falls relatively much more at the timing ②, that is, before the operation of the internal circuit 160 is finished. Hence, if the level of the internal voltage (VINT) terminal falls below the allowable lower limit, the normal data input/output operations are disturbed and the operation of the semiconductor memory device becomes unstable.

Furthermore, at the timing ③ where the operation of the internal circuit 160 is finished, a relatively long time is taken to increase the level of the internal voltage (VINT) terminal to the target level.

SUMMARY OF THE INVENTION

Embodiments of the present invention are directed to providing an internal voltage generating circuit, which detects a level variation of an external power supply voltage (VDD) and changes the driving ability of an internal voltage driver driving an internal voltage terminal, so that an internal voltage is maintained at a stable level during the operations of internal circuits of a semiconductor memory device. Driving ability may be increased, for example, by increasing a number of drivers employed, and/or by improving an ability of a driver or drivers to drive a load or loads.

In accordance with an aspect of the invention, a semiconductor memory device includes a voltage detector configured to detect a level of an external power supply voltage and an internal voltage generator configured to generate an internal voltage in response to an active signal and drive an internal voltage terminal with a driving ability corresponding to an output signal of the voltage detector. In accordance with another aspect of the invention, a semiconductor memory device includes a voltage detector configured to detect a level of an external power supply voltage, a first internal voltage generator configured to generate an internal voltage in response to an active signal and a second internal voltage generator configured to generate the internal voltage in response to the active signal, the second internal voltage generator being turned on/off in response to an output signal of the voltage detector. In accordance with another aspect of the invention, a semiconductor memory device, comprising a voltage detector configured to detect a level of an external power supply voltage, a first internal voltage generator configured to generate an internal voltage in response to an active signal, and a second internal voltage generator configured to generate the internal voltage in response to the active signal, the second internal voltage generator being turned on/off in response to an output signal of the voltage detector. In accordance with another aspect of the invention, a semiconductor memory device, comprising a voltage detector configured to detect a level of an external power supply voltage; a first internal voltage generator configured to generate an internal voltage in response to an active signal; and a second internal voltage generator configured to generate the internal voltage in response to an output signal of the voltage detector. In accordance with another aspect of the invention, a semiconductor memory device, comprising a internal voltage detecting unit for detecting a level of the internal voltage terminal and being turned on/off in response to an active signal and a detection signal; and a internal voltage driving unit for driving the internal voltage terminal with a predetermined driving ability in response to an output signal of the internal voltage detecting unit. In accordance with another aspect of the invention, a method for operating a semiconductor memory device includes detecting a level of an external power supply voltage, based on a first target level, to output a detection signal; and generating an internal voltage in response to an active signal, and driving an internal voltage terminal with a driving ability corresponding to the detection signal.

BRIEF DESCRIPTION OF THE DRAWINGS

FIG. 8 is a circuit diagram of an internal voltage generator of FIG. 4 which has a different structure from that of FIGS. 5 and 7.

DESCRIPTION OF SPECIFIC EMBODIMENTS

Hereinafter, a semiconductor memory device in accordance with the present invention will be described in detail with reference to the accompanying drawings.

Figure 4:
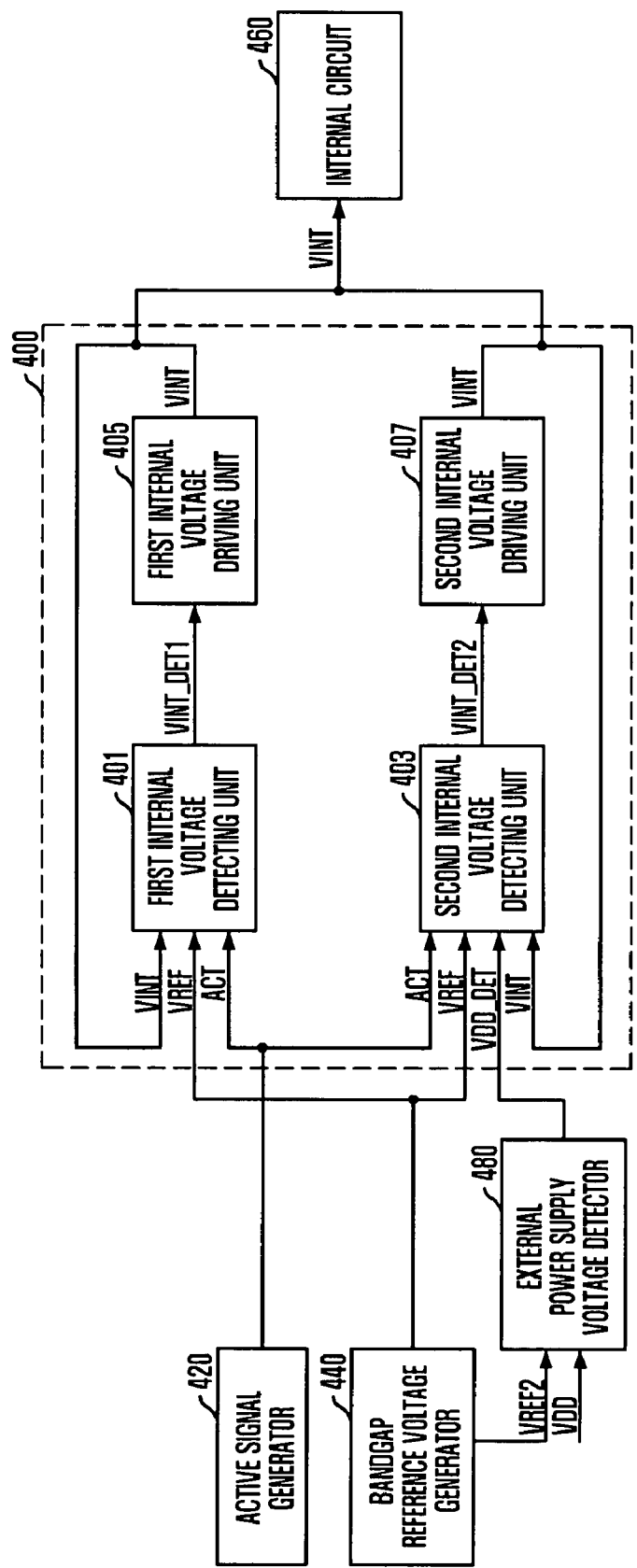
FIG. 4 is a block diagram of a semiconductor memory device in accordance with an embodiment of the present invention.

FIG. 4 is a block diagram of a semiconductor memory device in accordance with an embodiment of the invention.

Referring to FIG. 4, the semiconductor memory device in accordance with the embodiment of the invention includes an active signal generator 420 for generating an active signal ACT, a level of which is determined according to an operation of the semiconductor memory device, a bandgap reference voltage generator 440 for generating a reference voltage VREF maintaining a constant target level, regardless of PVT variation of the semiconductor memory device, an external power supply voltage detector 480 for detecting a level of an external power supply voltage VDD, and an internal voltage generator 400 for generating an internal voltage VINT in response to the active signal ACT and driving an internal voltage (VINT) terminal with a driving ability corresponding to an output signal of the external power supply voltage detector 480. The external power supply voltage detector 480 detects a level of the external power supply voltage VDD, based on a first target level, and outputs a detection signal VDD_DET corresponding to the detection result.

The internal voltage generator 400 includes a first internal voltage detecting unit 401, a second internal voltage detecting unit 403, a first internal voltage driving unit 405, and a second internal voltage driving unit 407. The first internal voltage detecting unit 401 detects a level of the internal voltage (VINT) terminal, based on a second target level. The first internal voltage detecting unit 401 is turned on/off in response to the active signal ACT. The second internal voltage detecting unit 403 detects a level of the internal voltage (VINT) terminal, based on a second target level. The second internal voltage detecting unit 403 is turned on/off in response to the active signal ACT and the detection signal VDD_DET. The first internal voltage driving unit 405 drives the internal voltage (VINT) terminal with a first driving ability in response to an output signal VINT_DET1 of the first internal voltage detecting unit 401. The second internal voltage driving unit 407 drives the internal voltage (VINT) terminal with a second driving ability in response to an output signal VINT_DET2 of the second internal voltage detecting unit 403. The internal voltage VINT generated through the above-described procedures is input to the internal circuit 460 and used to enable the internal circuit 460 to perform a predefined internal operation.

In the internal voltage generator 400, a detailed circuit of the internal voltage driving units 405 and 407 may be changed according to the kinds of the generated internal voltage. For example, a circuit for the pumping voltage (VPP) generated by the charge pumping operation is different from a circuit for the core voltage (VCORE) generated by the down-converting operation. However, their generation principles are similar to each other. Therefore, the circuit for the core voltage (VCORE) generated by the down-converting operation, which is simpler in the circuit configuration, will be described below. That is, the internal voltage VINT refers to the core voltage VCORE in the following description.

Figure 5:
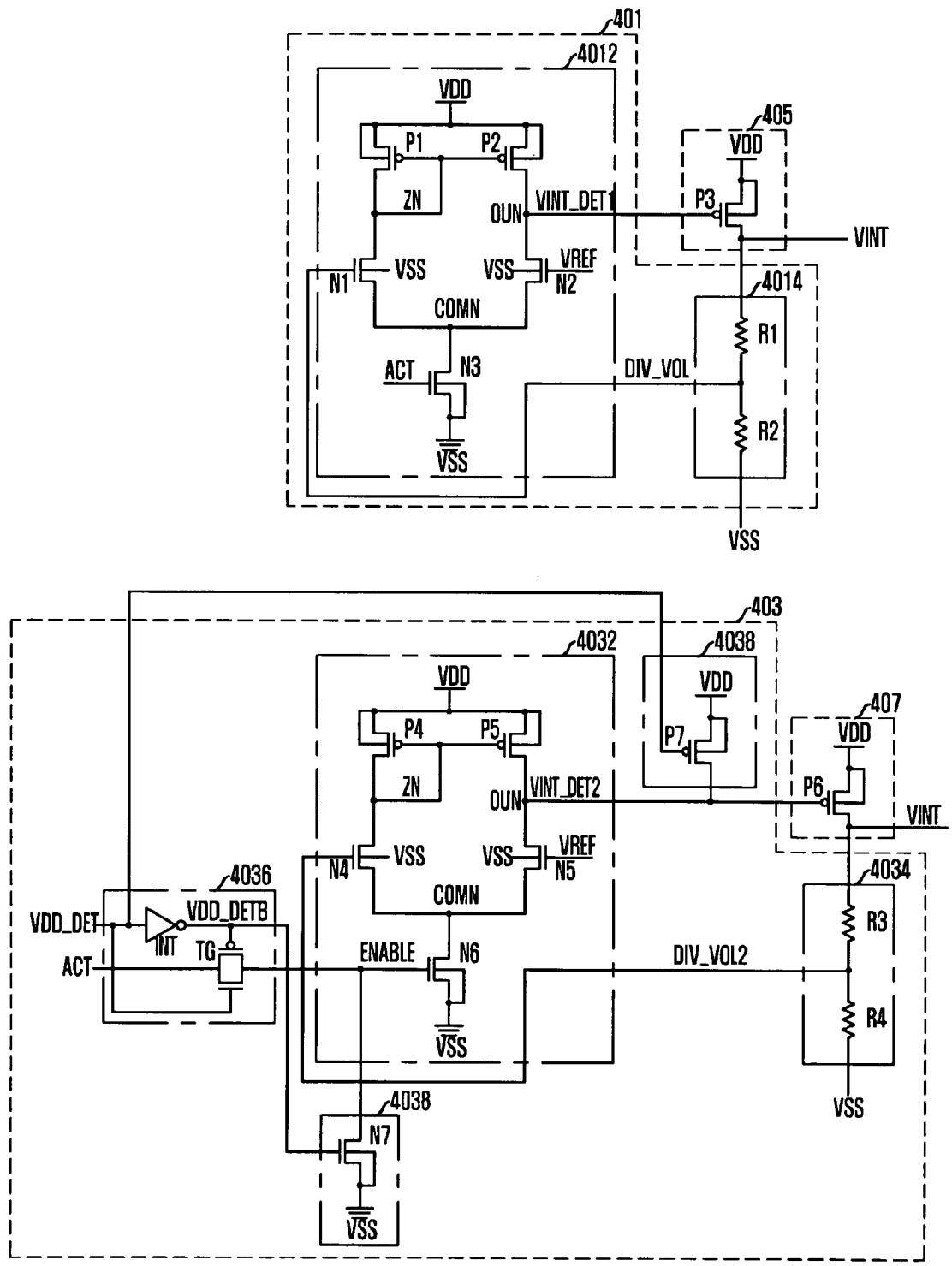
FIG. 5 is a circuit diagram of an internal voltage generator of FIG. 4.

FIG. 5 is a circuit diagram of the internal voltage generator of FIG. 4.

Referring to FIG. 5, the first internal voltage detecting unit 401 of the internal voltage generator 400 includes a voltage comparator 4012 and a voltage divider 4014. The voltage comparator 4012 compares the reference voltage VREF corresponding to the second target level with the divided voltage DIV_VOL1 to output a comparison signal VINT_DET1. The voltage comparator 4012 is turned on/off in response to the active signal ACT input as a bias signal. The voltage divider 4014 divides a level of the internal voltage (VINT) terminal at a predefined ratio to generate a divided voltage DIV_VOL1.

Figure 1:
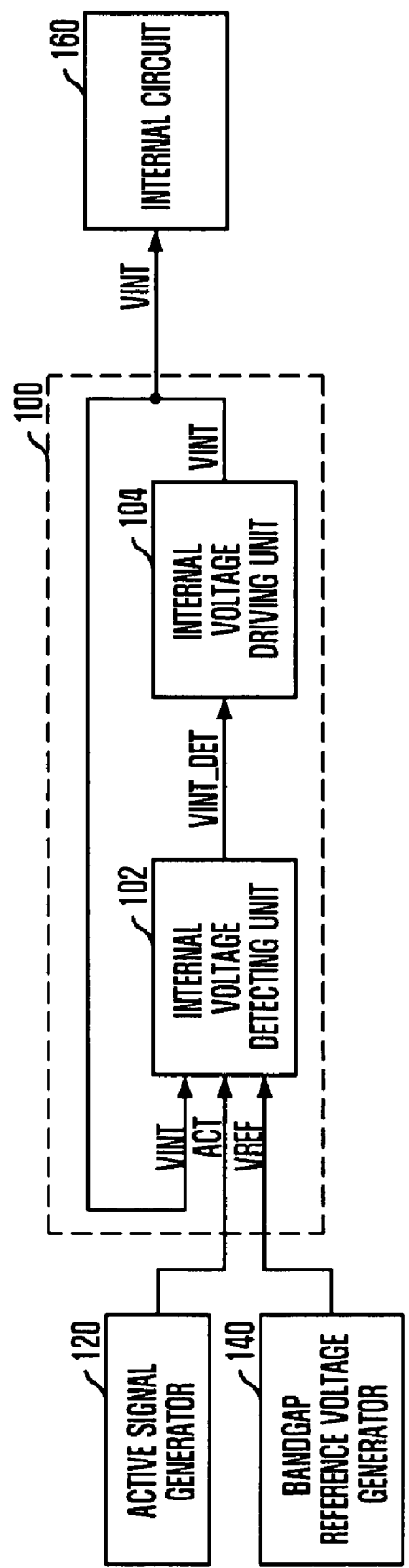
FIG. 1 is a block diagram of a conventional semiconductor memory device.
Figure 2:
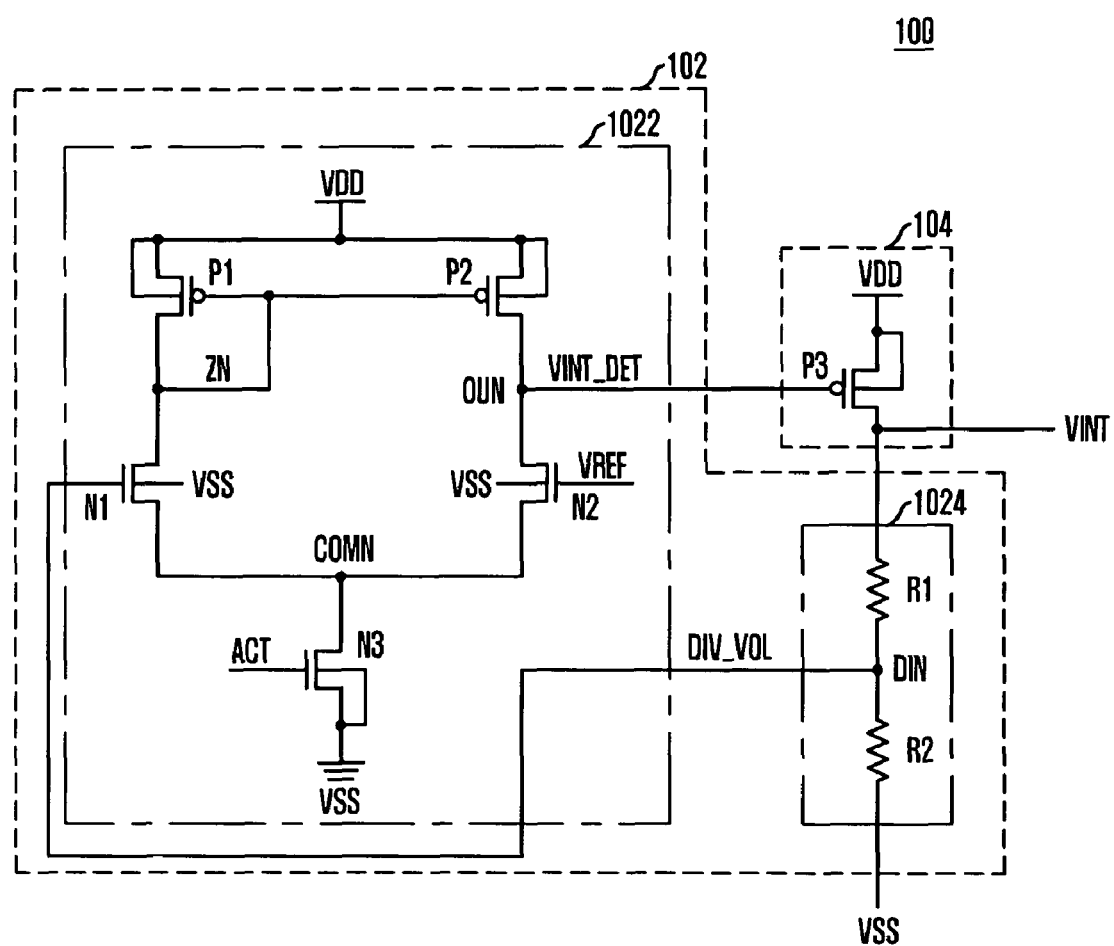
FIG. 2 is a circuit diagram of an internal voltage generator of FIG. 1.
Figure 3:
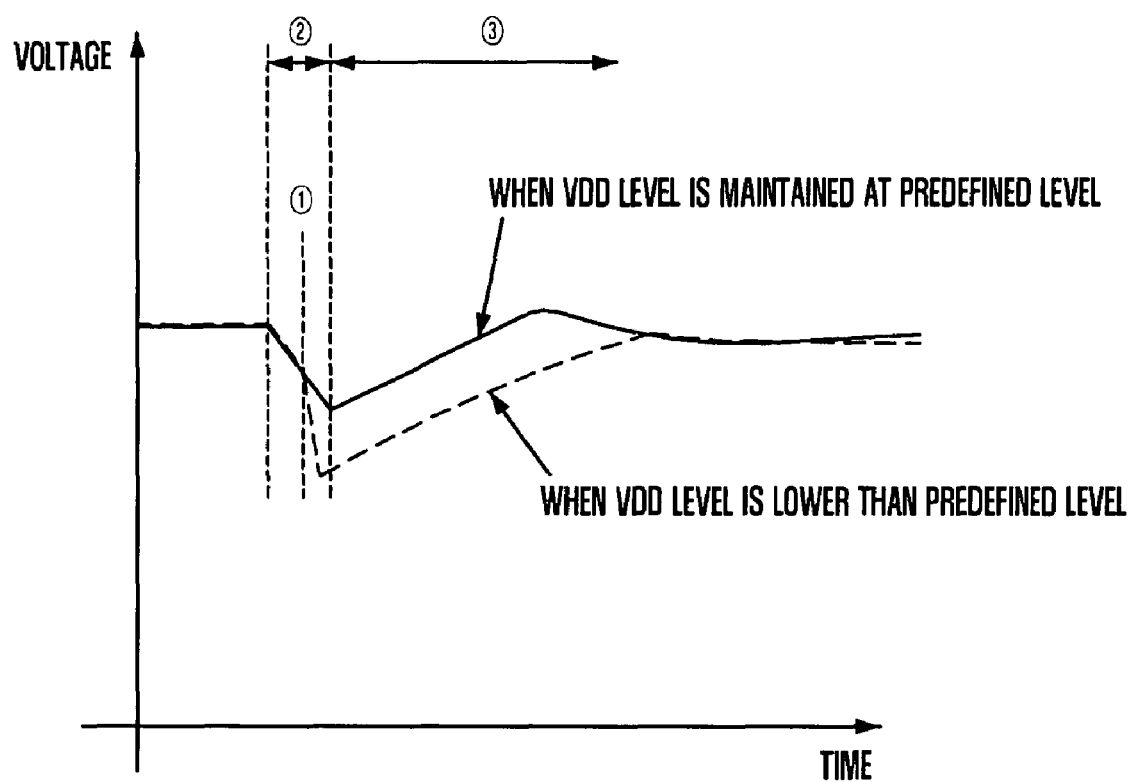
FIG. 3 is a waveform diagram of an internal voltage during the operation of generating the internal voltage in the conventional semiconductor memory device of FIG. 1.

Since the first internal voltage detecting unit 401 has the same structure as the internal voltage detecting unit 102 of the internal voltage generator 100 of FIG. 2, detailed description thereof will be omitted.

The second internal voltage detecting unit 403 of the internal voltage generator 400 includes a voltage comparator 4032, a logic determiner 4036, a reset controller 4038, and a voltage divider 4034. The voltage comparator 4032 compares the reference voltage VREF corresponding to the second target level with the divided voltage DIV_VOL2 to output a comparison signal VINT_DET2. The voltage comparator 4032 is turned on/off in response to an enable signal ENABLE input as a bias signal. The logic determiner 4036 determines a logic level of the enable signal ENABLE in response to the detection signal VDD_DET and the active signal ACT. The reset controller 4038 controls the resetting of the voltage comparator 4032 in response to the detection signal VDD_DET. The voltage divider 4034 divides the level of the internal voltage (VINT) terminal at a predefined ratio to generate the divided voltage DIV_VOL2.

The voltage comparator 4032 of the second internal voltage detecting unit 403 includes a first NMOS transistor N4, a second NMOS transistor N5, a first PMOS transistor P4, a second PMOS transistor P5, and a third NMOS transistor N6. The first NMOS transistor N4 has a gate receiving the divided voltage DIV_VOL2, and a drain and a source connected between a driving node ZN and a common node COMM. The first NMOS transistor N4 controls a current flowing between the driving node ZN and the common node COMM in response to the divided voltage DIV_VOL2. The second NMOS transistor N5 has a gate receiving the reference voltage VREF, and a drain and a source connected between an output node OUN and the common node COMM. The second NMOS transistor N5 controls a current flowing between the output node OUN and the common node COMM in response to the reference voltage VREF. The first PMOS transistor P4 and the second PMOS transistor P5 are connected between the driving node ZN and the output node OUN in a current mirror configuration and equalizes the current flowing through the driving node ZN and the current flowing through the output node OUN. The third NMOS transistor N6 has a gate receiving the enable signal ENABLE, and a drain and source connected between the common node COMM and the ground voltage (VSS) terminal. The third NMOS transistor N6 controls the electrical connection of the common node COMM and the ground voltage (VSS) terminal in response to the enable signal ENABLE.

The logic determiner 4036 of the second internal voltage detecting unit 403 includes an inverter INT and a transfer gate TG. The inverter INT inverts the detection signal VDD_DET, and the transfer gate TG controls the logic level synchronization of the active signal ACT and the enable signal ENABLE in response to the detection signal VDD_DET and the inverted detection signal VDD_DETB.

The reset controller 4038 of the second internal voltage detecting unit 403 includes a PMOS transistor P7 and an NMOS transistor N7. The PMOS transistor P7 has a gate receiving the detection signal VDD_DET, and a source and a drain connected between the power supply voltage (VDD) terminal and the output terminal OUN of the voltage comparator 4032. The PMOS transistor P7 forcibly deactivates the comparison signal VINT_DET2 by controlling the electrical connection of the power supply voltage (VDD) terminal and the output terminal OUN of the voltage comparator 4032 in response to the detection signal VDD_DET. The NMOS transistor N7 has a gate receiving the inverted detection signal VDD_DETB, and a drain and source connected between a bias input terminal of the voltage comparator 4032 and the ground voltage (VSS) terminal. The NMOS transistor N7 forcibly deactivates the enable signal ENABLE by controlling the electrical connection of the bias input terminal of the voltage comparator 4032 and the ground voltage (VSS) terminal in response to the inverted detection signal VDD_DETB.

The voltage divider 4034 of the second internal voltage detecting unit 403 includes a first resistor R3 and a second resistor R4 that are connected in series between the internal voltage (VINT) terminal and the ground voltage (VSS) terminal and have predefined resistances. The divided voltage DIV_VOL2 is output through the connection node of the first resistor R3 and the second resistor R4.

The operation of the internal voltage generator 400 of the semiconductor memory device in accordance with the embodiment of the invention will be described below.

When the active signal ACT output from the active signal generator 420 is activated, the internal voltage generator 400 starts to operate. The bandgap reference voltage generator 440 must already start to operate to generate the reference voltage VREF corresponding to the second target level. In addition, the external power supply voltage detector 480 must already start to operate to detect if the level of the external power supply voltage VDD is higher than the first target level and output the detection signal VDD_DET.

When the internal voltage generator 400 starts to operate, the first internal voltage detecting unit 401 detects if the level of the internal voltage (VINT) terminal is higher than the second target level of the reference voltage VREF. At this point, when the level of the internal voltage (VINT) terminal is higher than the second target level, the internal voltage (VINT) terminal need not be driven. Thus, the first internal voltage detecting unit 401 outputs the deactivated internal voltage detection signal VINT_DET1. When the level of the internal voltage (VINT) terminal is lower than the second target level, the internal voltage (VINT) terminal must be driven. Thus, the first internal voltage detecting unit 401 outputs the activated internal voltage detection signal VINT_DET1.

When the activated detection signal VDD_DET is input from the external power supply voltage detector 480, the second internal voltage detecting unit 403 detects if the level of the internal voltage (VINT) terminal is higher than the second target level of the reference voltage VREF. However, when the deactivated detection signal VDD_DET is input from the external power supply voltage detector 480, the second internal voltage detecting unit 403 does not operate. On the contrary, when the detection signal VDD_DET is activated and the level of the internal voltage (VINT) terminal is higher than the second target level during the operation of the second internal voltage detecting unit 403, the internal voltage (VINT) terminal need not be driven. Thus, the second internal voltage detecting unit 403 outputs the deactivated internal voltage detection signal VINT_DET2. When the level of the internal voltage (VINT) terminal is lower than the second target level, the internal voltage (VINT) terminal must be driven. Thus, the second internal voltage detecting unit 403 outputs the activated internal voltage detection signal VINT_DET2.

When the deactivated internal voltage detection signals VINT_DET1 and VINT_DET2 are applied, the first internal voltage driving unit 405 and the second internal voltage driving unit 407 perform no operations. On the contrary, when the activated internal voltage detection signals VINT_DET1 and VINT_DET2 are applied, the first internal voltage driving unit 405 and the second internal voltage driving unit 407 perform the operation of driving the internal voltage VINT.

At this point, the first internal voltage driving unit 405 and the second internal voltage driving unit 407 drive the internal voltage VINT to the external power supply voltage VDD by using a driver having a predefined driving ability. That is, since the level of the internal voltage (VINT) terminal does not reach the target level, the level of the internal voltage (VINT) terminal is increased by applying the external power supply voltage VDD higher than the target level to the internal voltage (VINT) terminal. In this way, when the first internal voltage driving unit 405 and the second internal voltage driving unit 407 operate to increase the level of the internal voltage (VINT) terminal above the target level, the first internal voltage detecting unit 401 and the second internal voltage detecting unit 403 detect the increased level of the internal voltage (VINT) terminal and stops the operations of the first internal voltage driving unit 405 and the second internal voltage driving unit 407.

By repeating the above-described operations, the internal voltage generator 400 operates such that the level of the internal voltage (VINT) terminal is always maintained at the target level in the activation period of the active signal ACT. Therefore, it appears as if the first internal voltage driving unit 405 and the second internal voltage driving unit 407 perform the same operation. However, the first internal voltage driving unit 405 and the second internal voltage driving unit 407 perform the same operation at a period where the active signal ACT is activated in a state that it has a level lower than the first target level, and the level of the internal voltage VINT is lower than the second target level.

That is, the first internal voltage driving unit 401 operates when the active signal ACT is activated and the level of the internal voltage VINT is lower than the second target level, whereas the second internal voltage driving unit 403 does not operate when the external power supply voltage VDD is higher than the first target level, even though the active signal ACT is activated and the level of the internal voltage VINT is lower than the second target level.

Therefore, even though the active signal ACT is activated and the level of the internal voltage VINT is lower than the second target level, the driving ability for driving the internal voltage (VINT) terminal is changed according to the level of the external power supply voltage VDD.

Figure 6:
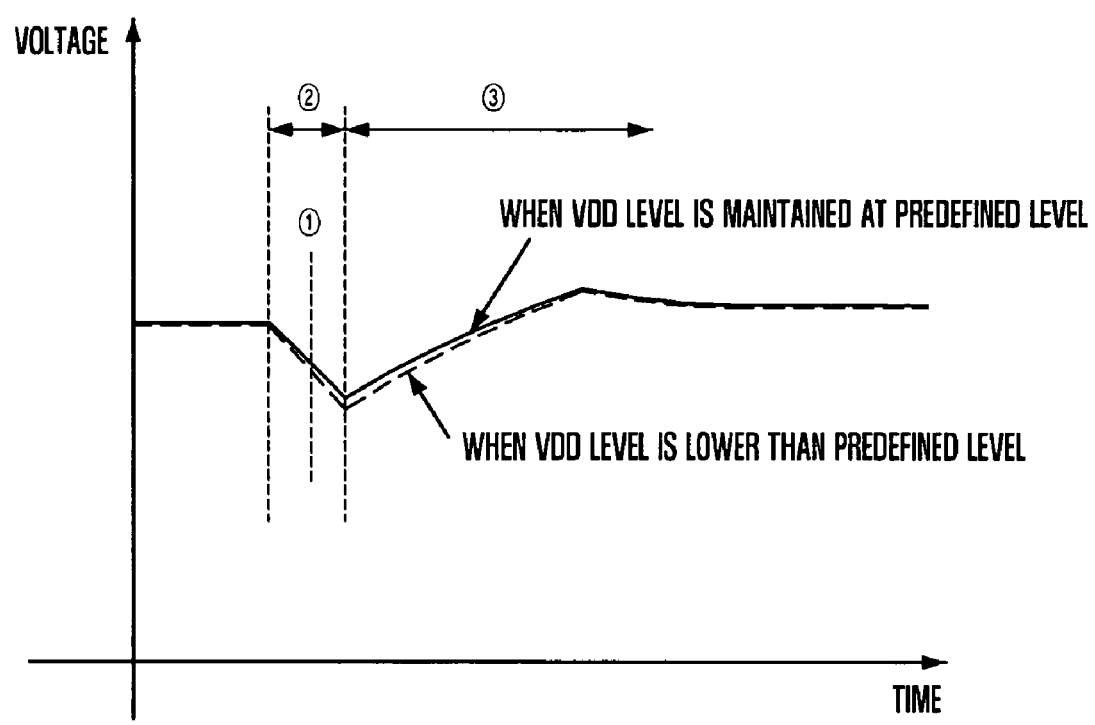
FIG. 6 is a waveform diagram of an internal voltage during the operation of generating the internal voltage in the semiconductor memory device of FIG. 4.

FIG. 6 is a waveform diagram of the internal voltage during the operation of generating the internal voltage in the semiconductor memory device of FIG. 4.

Referring to FIG. 4, at a timing ① where the first internal voltage driving unit 405 and the second internal voltage driving unit 407 start to operate, the internal circuit 460 uses the internal voltage VINT in operation so that the level of the internal voltage (VINT) terminal becomes lower than the second target level. In addition, since the timing ① is a timing where the operation of the internal circuit 460 is not finished, it is expected that the level of the internal voltage (VINT) terminal will continuously fall.

Therefore, the first internal voltage driving unit 405 and the second internal voltage driving unit 407 must prevent the level of the internal voltage (VINT) terminal from being further lowered at a timing ② where the operation of the internal circuit 160 is not finished, and increase the level of the internal voltage (VINT) terminal at a timing ③ where the operation of the internal circuit 460 is finished, so that the level of the internal voltage (VINT) terminal can maintain the voltage level corresponding to the target level.

When the level of the external power supply voltage VDD is maintained at the predefined level, only the first internal voltage driving unit 405 of the internal voltage generator 400 operates, so that the driving ability is relatively low. However, since the level of the external power supply voltage VDD is maintained at the predefined level, the level of the internal voltage (VINT) terminal does not fall below the allowable lower limit at the timing ②, that is, before the operation of the internal circuit 460 is finished. Also, the level of the internal voltage (VINT) terminal is increased in a relatively short time at the timing ③ where the operation of the internal circuit 460 is finished, so that the level of the internal voltage (VINT) terminal can maintain the level corresponding target level.

When the level of the external power supply voltage VDD is lower than the predefined level, both the first internal voltage driving unit 405 and the second internal voltage driving unit 407 of the internal voltage generator 400 operate so that the internal voltage (VINT) nodded is driven with a relatively high driving ability. Therefore, the level of the internal voltage (VINT) terminal does not fall below the allowable lower limit at the timing ②, that is, before the operation of the internal circuit 460 is finished. Also, the level of the internal voltage (VINT) terminal is increased in a relatively short time at the timing ③ where the operation of the internal circuit 460 is finished, so that the level of the internal voltage (VINT) terminal can maintain the level corresponding target level.

That is, there is no great difference in the level variation of the internal voltage VINT in the case where the level of the external power supply voltage VDD is lower than the predefined level and the case where the level of the external power supply voltage VDD is maintained at the predefined level.

Figure 7:
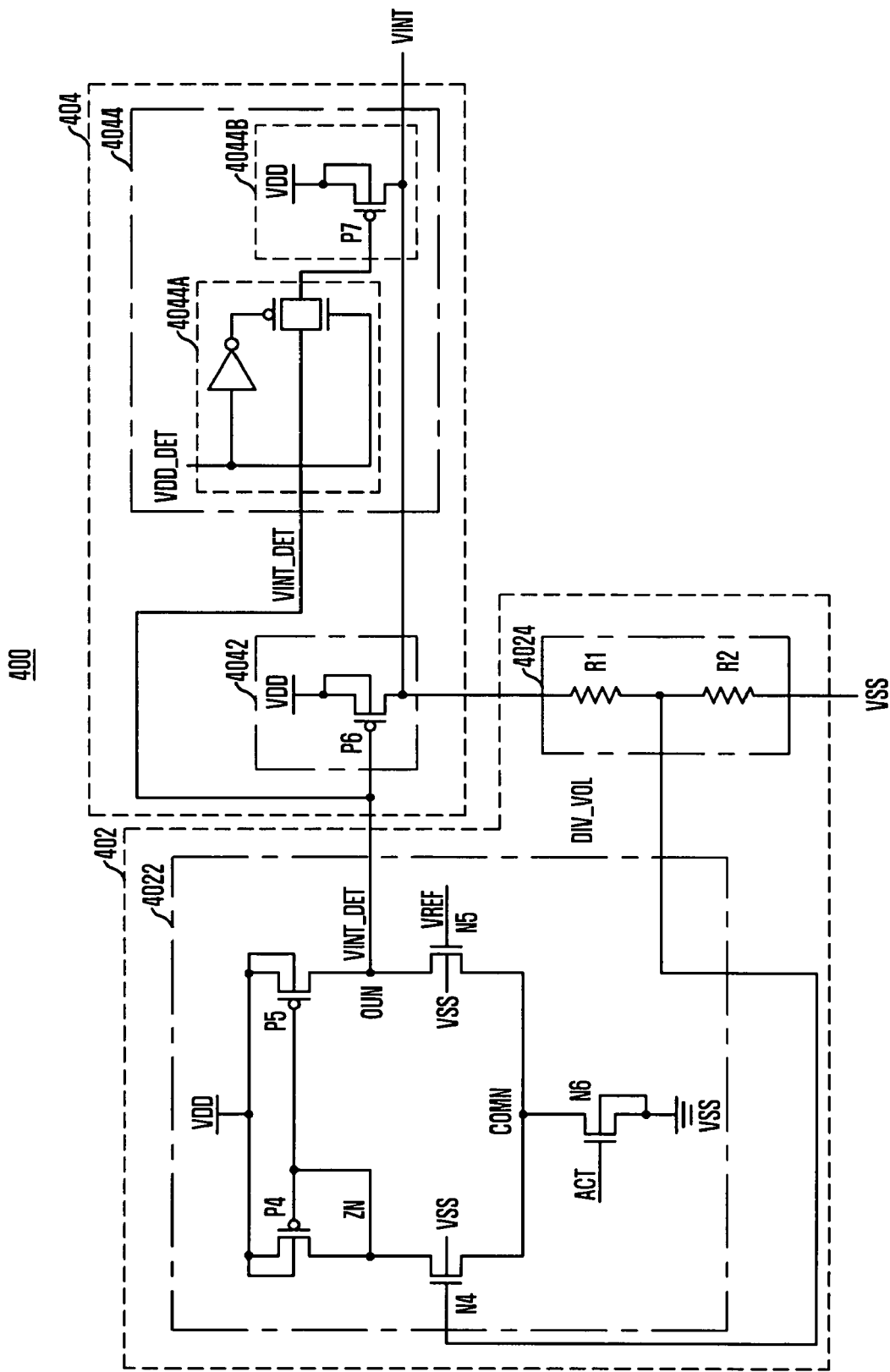
FIG. 7 is a circuit diagram of an internal voltage generator of FIG. 4 which has a different structure from that of FIG. 5.

FIG. 7 is a circuit diagram of the internal voltage generator of FIG. 4, which has a different structure from that of FIG. 5.

Referring to FIG. 7, while the internal voltage generator 400 of FIG. 4 includes the first and second internal voltage detecting units 401 and 403 and the first and second internal voltage driving units 405 and 407, the internal voltage generator 400 of FIG. 7 includes an internal voltage detecting unit 402 and an internal voltage driving unit 404.

Specifically, in the internal voltage generator 400 of FIG. 7, the internal voltage detecting unit 402 detects the level of the internal voltage (VINT) terminal, based on the second target level. The internal voltage detecting unit 402 is turned on/off in response to the active signal ACT. The internal voltage driving unit 404 drives the internal voltage (VINT) terminal with the driving ability that is selectively changed in response to the output signal VINT_DET of the internal voltage detecting unit 402 and the detection signal VDD_DET.

The internal voltage detecting unit 402 includes a voltage comparator 4022 and a voltage divider 4024. The voltage comparator 4022 compares the reference voltage VREF corresponding to the second target level with the divided voltage DIV_VOL to output a comparison signal. The voltage comparator 4022 is turned on/off in response to the active signal ACT input as a bias signal. The voltage divider 4024 divides the level of the internal voltage (VINT) terminal at a predefined ratio to generate the divided voltage DIV_VOL.

The internal voltage driving unit 404 includes a first driver 4042 for driving the internal voltage (VINT) terminal with a first driving ability in response to the output signal VINT_DET of the internal voltage detecting unit 402, and a second driver 4044 for driving the internal voltage (VINT) terminal with a second driving ability in response to the output signal VINT_DET of the internal voltage detecting unit 402. The second driver 4044 is turned on/off in response to the detection signal VDD_DET.

The second driver 4044 of the internal voltage driving unit 404 includes a transfer controller 4044A and a driver 4044B. The transfer controller 4044A transfers the output voltage VINT_DET of the internal voltage detecting unit 402, which is input through an input terminal IN, to an output terminal in response to the detection signal VDD_DET. The driver 4044B drives the internal voltage (VINT) terminal with the second driving ability in response to the signal applied to the output terminal of the transfer controller 4044A.

The operation of the internal voltage generator 400 of FIG. 7 will be described below.

The bandgap reference voltage generator 440 must already start to operate to generate the reference voltage VREF corresponding to the second target level. Also, the external power supply voltage detector 480 must already start to operate to detect if the level of the external power supply voltage VDD is higher than the first target level and output the detection signal VDD_DET.

When the activated active signal ACT is input from the active signal generator 420, the internal voltage generator 400 starts to operate.

When the internal voltage generator 400 starts to operate, the internal voltage detecting unit 402 detects if the level of the internal voltage (VINT) terminal is higher than the second target level of the reference voltage VREF. At this point, when the level of the internal voltage (VINT) terminal is higher than the second target level, the internal voltage (VINT) terminal need not be driven. Thus, the internal voltage detecting unit 402 outputs the deactivated internal voltage detection signal VINT_DET. When the level of the internal voltage (VINT) terminal is lower than the second target level, the internal voltage (VINT) terminal must be driven. Thus, the internal voltage detecting unit 402 outputs the activated internal voltage detection signal VINT_DET.

When the deactivated internal voltage detection signal VINT_DET is applied, the internal voltage driving unit 404 performs no operations. On the contrary, when the activated internal voltage detection signal VINT_DET is applied, the internal voltage driving unit 404 performs the operation of driving the internal voltage VINT.

At this point, when the level of the external power supply voltage VDD becomes lower than the first target level and the activated detection signal VDD_DET is input from the external power supply voltage detector 480, the first and second drivers 4042 and 4044 of the internal voltage driving unit 404 operate to drive the internal voltage (VINT) terminal with a driving ability corresponding to the sum of the first driving ability and the second driving ability.

However, when the level of the external power supply voltage VDD becomes higher than the first target level and the deactivated detection signal VDD_DET is input from the external power supply voltage detector 480, only the first driver 4042 of the internal voltage driving unit 404 operates and the second driver 4044 does not operate. Thus, the internal voltage (VINT) terminal is driven with the first driving ability. That is, like the internal voltage generator 400 of FIG. 5, the driving ability for driving the internal voltage (VINT) terminal is changed according to the level of the external power supply voltage VDD.

As described above, when the level of the external power supply voltage VDD is unstably fluctuated by the PVT variation of the semiconductor memory device, especially when the level of the external power supply voltage VDD is lower than the predefined level, the internal voltage is generated with the driving ability that is changed according to the PVT variation. Therefore, when the internal voltage is used relatively much more due to the operations of the internal circuits included in the semiconductor memory device, the level of the internal voltage is changed within the predefined level. That is, the internal voltage can be always maintained at a stable level.

The level of the internal voltage can be stably maintained even when the level of the external power supply voltage VDD is unstably changed, thereby ensuring the stable operation of the semiconductor memory device.

FIG. 8 is a circuit diagram of an internal voltage generator of FIG. 4 which has a different structure from that of FIGS. 5 and 7.

Referring to FIG. 8, the internal voltage generator of FIG. 8 is activated by only a detection signal VDD_DET without the active signal ACT. Since the first internal voltage detecting unit 401 has the same structure as the first internal voltage detecting unit 401 of FIG. 5, detailed description thereof will be omitted.

While the invention has been described with respect to the specific embodiments, it will be apparent to those skilled in the art that various changes and modifications may be made without departing from the spirit and scope of the invention as defined in the following claims.

Although the internal voltage generator designed to drive the internal voltage terminal with the first driving ability or the driving ability corresponding to the sum of the first driving ability and the second driving ability have been described, the invention can also drive the internal voltage terminal with a driving ability having a fine variation width by using a larger number of drivers.

Furthermore, although it has been assumed in the above embodiments that the internal voltage is the core voltage, the internal voltage can also be the pumping voltage or the back bias voltage.

In the above embodiments, the locations and types of the logic gates and transistors may be modified according to the polarities of the input signals.

What is claimed is:

1. A semiconductor memory device, comprising:
   a voltage detector configured to detect a level of an external power supply voltage based on a first target level, and to output a detection signal according to the detection result;
   a first internal voltage detecting unit configured to detect a level of the internal voltage terminal, based on a second target level, the first internal voltage detecting unit being turned on/off in responses to the active signal;
   a second internal voltage detecting unit configured to detect the level of the internal voltage terminal, based on the second target level, the second internal voltage detecting unit being turned on/off in response to the active signal and the detection signal;
   a first internal voltage driving unit configured to drive the internal voltage terminal with a first driving ability in response to an output signal of the first internal voltage detecting unit; and
   a second internal voltage driving unit configured to drive the internal voltage terminal with a second driving ability in response to an output signal of the second internal voltage detecting unit, wherein both the first and second internal voltage detecting units are turned on when the active signal and the detection signal are activated.

2. The semiconductor memory device as recited in claim 1, wherein the first internal voltage detecting unit includes:
a voltage comparator configured to compare a reference voltage corresponding to the second target level with a divided voltage to output a comparison signal, the voltage comparator being turned on/off in response to the active signal input as a bias signal, and
a voltage divider configured to divide the level of the internal voltage at a predefined ratio to generate the divided voltage.

3. The semiconductor memory device as recited in claim 1, wherein the second internal voltage detecting unit includes:
a voltage comparator configured to compare a reference voltage corresponding to the second target level with a divided voltage to output a comparison signal, the voltage comparator being turned on/off in response to an enable signal input as a bias signal;
a logic determiner configured to determine a logic level of the enable signal in response to the detection signal and the active signal;
a reset controller configured to control a resetting of the voltage comparator in response to the detection signal; and
a voltage divider configured to divide the level of the internal voltage at a predefined ratio to generate the divided signal.

4. The semiconductor memory device as recited in claim 3, wherein the voltage comparator includes:
a first NMOS transistor having a gate receiving the divided voltage, and a drain and a source connected between a driving node and a common node, the first NMOS transistor controlling a current flowing between the driving node and the common node according to a level of the divided voltage;
a second NMOS transistor having a gate receiving the reference voltage, and a drain and a source connected between an output node and the common node, the second NMOS transistor controlling a current flowing between the output node and the common node according to a level of the reference voltage;
a first PMOS transistor and a second PMOS transistor connected between the driving node and the output node in a current mirror configuration and equalizing the current flowing through the driving node and the current flowing through the output node; and
a third NMOS transistor having a gate receiving the enable signal, and a drain and source connected between the common node and a ground voltage terminal, the third NMOS transistor controlling the electrical connection of the common node and the ground voltage terminal in response to the enable signal.

5. The semiconductor memory device as recited in claim 3, wherein the logic determiner includes:
an inverter configured to invert the detection signal, and
a transfer gate configured to control a logic level synchronization of the active signal and the enable signal in response to the detection signal and an output signal of the inverter, which are respectively input through a positive input terminal and a negative input terminal.

6. The semiconductor memory device as recited in claim 3, wherein the reset controller includes:
a PMOS transistor having a gate receiving the detection signal, and a source and a drain connected between a power supply voltage terminal and an output terminal of the voltage comparator, the PMOS transistor controlling the electrical connection of the power supply voltage terminal and the output terminal of the voltage comparator; and
an NMOS transistor having a gate receiving the inverted detection signal, and a drain and a source connected between a bias input terminal of the voltage comparator and a ground voltage terminal, the NMOS transistor forcibly deactivating the enable signal.

7. The semiconductor memory device as recited in claim 3, wherein the voltage divider includes a first resistor and a second resistor connected in series between the internal voltage terminal and a ground voltage terminal and having predefined resistances, the divided voltage being output through a connection node of the first resistor and the second resistor.

8. A semiconductor memory device, comprising:
a voltage detector configured to detect a level of an external power supply voltage based on a first target level, and to output a detection signal according to the detection result; and
an internal voltage generator configured to generate an internal voltage in response to an active signal and to drive an internal voltage terminal with a driving ability corresponding to an output signal of the voltage detector, the internal voltage generator including an internal voltage detecting unit configured to detect a level of the internal voltage terminal, based on a second target level, the internal voltage detecting unit being turned on/off in response to the active signal, and
an internal voltage driving unit configured to drive the internal voltage terminal with a driving ability that is selectively changed in response to an output signal of the internal voltage detecting unit and the detection signal.

9. The semiconductor memory device as recited in claim 8, wherein the internal voltage detecting unit includes:
a voltage comparator configured to compare a reference voltage corresponding to the second target level with a level of a divided voltage to output a comparison signal, the voltage comparator being turned on/off in response to the active signal input as a bias signal, and
a voltage divider configured to divide a level of the internal voltage terminal at a predefined ratio to generate the divided voltage.

10. The semiconductor memory device as recited in claim 8, wherein the internal voltage driving unit includes:
a first driver configured to drive the internal voltage terminal with a first driving ability in response to an output signal of the internal voltage detecting unit, and
a second driver configured to drive the internal voltage terminal with a second driving ability in response to the output signal of the internal voltage detecting unit, the second driver being turned on/off in response to the detection signal.

11. A semiconductor memory device, comprising:
a voltage detector configured to detect a level of an external power supply voltage based on a first target level, and to output a detection signal according to the detection result,
a first internal voltage generator configured to generate an internal voltage in response to an active signal, and
a second internal voltage generator configured to generate the internal voltage in response to the active signal, the second internal voltage generator being turned on/off in response to an output signal of the voltage detector,
wherein the first internal voltage generator includes:
an internal voltage detecting unit configured to detect a level of an internal voltage terminal, based on a second target level, the internal voltage detecting unit being turned on/off in response to the active signal, and an internal voltage driving unit configured to drive the internal voltage terminal with a predefined driving ability in response to an output signal of the internal voltage detecting unit, wherein the internal voltage detecting unit includes:
a voltage comparator configured to compare a reference voltage corresponding to the second target level with a level of a divided voltage, the voltage comparator being turned on/off in response to the active signal input as a bias signal, and a voltage divider configured to divide the level of the internal voltage terminal at a predefined ratio to generate the divided voltage.

12. The semiconductor memory device as recited in claim 11, wherein the second internal voltage generator includes:
an internal voltage detecting unit configured to detect a level of an internal voltage terminal, based on a second target level, the internal voltage detecting unit being turned on/off in response to the active signal and the detection signal, and an internal voltage driving unit configured to drive the internal voltage terminal with a predefined driving ability in response to an output signal of the internal voltage detecting unit.

13. The semiconductor memory device as recited in claim 12, wherein the internal voltage detecting unit includes:
a voltage comparator configured to compare a reference voltage corresponding to the second target level with a divided voltage to output a comparison signal, the voltage comparator being turned on/off in response to an enable signal input as a bias signal;

a logic determiner configured to determine a logic level of the enable signal in response to the detection signal and the active signal;

a reset controller configured to control a resetting of the voltage comparator in response to the detection signal; and a voltage divider configured to divide the level of the internal voltage at a predefined ratio to generate the divided signal.

14. The semiconductor memory device as recited in claim 13, wherein the voltage comparator includes:
a first NMOS transistor having a gate receiving the divided voltage, and a drain and a source connected between a driving node and a common node, the first NMOS transistor controlling a current flowing between the driving node and the common node according to a level of the divided voltage;

a second NMOS transistor having a gate receiving the reference voltage, and a drain and a source connected between an output node and the common node, the second NMOS transistor controlling a current flowing between the output node and the common node according to a level of the reference voltage;

a first PMOS transistor and a second PMOS transistor connected between the driving node and the output node in a current mirror configuration and equalizing the current flowing through the driving node and the current flowing through the output node; and a third NMOS transistor having a gate receiving the enable signal, and a drain and source connected between the common node and a ground voltage terminal, the third NMOS transistor controlling the electrical connection of the common node and the ground voltage terminal in response to the enable signal.

15. The semiconductor memory device as recited in claim 13, wherein the logic determiner includes:
an inverter configured to invert the detection signal, and
a transfer gate configured to control a logic level synchronization of the active signal and the enable signal in response to the detection signal and an output signal of the inverter, which are respectively input through a positive input terminal and a negative input terminal.

16. The semiconductor memory device as recited in claim 13, wherein the reset controller includes:
a PMOS transistor having a gate receiving the detection signal, and a source and a drain connected between a power supply voltage terminal and an output terminal of the voltage comparator, the PMOS transistor forcibly deactivating the comparison signal by controlling the electrical connection of the power supply voltage terminal and the output terminal of the voltage comparator; and an NMOS transistor having a gate receiving the inverted detection signal, and a drain and a source connected between a bias input terminal of the voltage comparator and a ground voltage terminal, the NMOS transistor forcibly deactivating the enable signal.

17. The semiconductor memory device as recited in claim 13, wherein the voltage divider includes a first resistor and a second resistor connected in series between the internal voltage terminal and a ground voltage terminal and having predefined resistances, the divided voltage being output through a connection node of the first resistor and the second resistor.

18. A method for operating a semiconductor memory device, the method comprising:
detecting a level of an external power supply voltage, based on a first target level, to output a detection signal, and generating an internal voltage in response to an active signal;

performing a first detecting operation to detect a level of an internal voltage terminal based on a second target level, the first detecting operation being turned on/off in response to the active signal;

driving the internal voltage terminal with a first driving ability in response to a signal output in the first detecting operation;

performing a second detecting operation to detect the level of the internal voltage terminal based on the second target level, the second detecting operation being turned on/off in response to the active signal and the detection signal; and driving the internal voltage terminal with a second driving ability in response to a signal output in the second detecting operation in response to the active signal and the detection signal, wherein both the first and second detecting operations are performed when the active signal and the detection signal are activated.

19. A method for operating a semiconductor memory device, the method comprising:
detecting a level of an external power supply voltage based on a first target level to output a detection signal, and generating an internal voltage in response to an active signal;

detecting a level of an internal voltage terminal, based on a second target level, the detecting operation being turned on/off in response to the active signal, and driving the internal voltage terminal with a driving ability that is selectively changed in response to the detection signal and a signal output in the operation of detecting the level of the internal voltage terminal in response to the active signal;

wherein both the first and second detecting operations are performed when the active signal and the detection signal are activated.

* * * * *